(12) United States Patent
Strangman et al.

(10) Patent No.: US 7,695,830 B2
(45) Date of Patent: Apr. 13, 2010

(54) NANOLAMINATE THERMAL BARRIER COATINGS

(75) Inventors: Thomas E. Strangman, Prescott, AZ (US); Derek Raybould, Devnille, NJ (US)

(73) Assignee: Honeywell International Inc., Morristown, NJ (US)

( * ) Notice: Subject to any disclaimer, the term of this patent is extended or adjusted under 35 U.S.C. 154(b) by 801 days.

(21) Appl. No.: 11/517,138

(22) Filed: Sep. 6, 2006

(65) Prior Publication Data

US 2010/0068507 A1    Mar. 18, 2010

(51) Int. Cl.
B32B 5/14 (2006.01)
B32B 15/04 (2006.01)

(52) U.S. Cl. .................. 428/701; 427/596; 428/702; 428/469; 428/472; 428/623; 428/613; 428/610; 428/632; 428/627; 428/633; 416/241 B; 416/241 R

(58) Field of Classification Search .................. None
See application file for complete search history.

(56) References Cited

U.S. PATENT DOCUMENTS

| 4,916,022 | A | 4/1990 | Solfest et al. |
|---|---|---|---|
| 5,955,182 | A | 9/1999 | Yasuda et al. |
| 6,090,490 | A | 7/2000 | Mokerji |
| 6,106,959 | A | 8/2000 | Vance et al. |
| 6,110,604 | A | 8/2000 | Rickerby |
| 6,210,813 | B1 | 4/2001 | Burke et al. |
| 6,299,988 | B1 | 10/2001 | Wang et al. |
| 6,312,763 | B1 | 11/2001 | Eaton, Jr. et al. |
| 6,482,537 | B1 | 11/2002 | Strangman et al. |
| 6,579,636 | B2 * | 6/2003 | Oguri et al. .................. 428/697 |
| 6,620,525 | B1 | 9/2003 | Rigney et al. |
| 6,733,908 | B1 | 5/2004 | Lee et al. |
| 6,759,151 | B1 * | 7/2004 | Lee .............................. 428/701 |
| 6,764,779 | B1 | 7/2004 | Liu et al. |
| 2003/0118873 | A1 | 6/2003 | Murphy |
| 2003/0207031 | A1 | 11/2003 | Strangman et al. |
| 2005/0112381 | A1 | 5/2005 | Raybould et al. |
| 2005/0196635 | A1 | 9/2005 | Johnson et al. |

FOREIGN PATENT DOCUMENTS

WO    0163008 A2    8/2001

OTHER PUBLICATIONS

EP Search Report, 07115769.7 dated Jan. 18, 2008.

* cited by examiner

*Primary Examiner*—Jennifer McNeil
*Assistant Examiner*—Vera Katz
(74) *Attorney, Agent, or Firm*—Ingrassia Fisher & Lorenz, P.C.

(57) ABSTRACT

An article having a thermal barrier coating includes a superalloy substrate having a columnar grained ceramic coat formed thereon. The ceramic coat includes a nanolaminate region comprising repeating layers of ceramic material with each layer being less than 500 nm in thickness, with dispersions of metal oxide doping material situated between each of the layers. The ceramic coat further includes a non-doped region having a thickness greater than 500 nm adjacent to the nanolaminate region, the non-doped region including one layer or a plurality of adjacent layers of ceramic material without dispersions of metal oxide doping material situated between each of the layers. In one embodiment, and by way of example only, a bond coat is formed between the substrate and the columnar grained ceramic coat. According to another embodiment, the superalloy substrate forms an adherent alumina scale, and no bond coat is necessary.

12 Claims, 3 Drawing Sheets

NANOLAMINATE THERMAL BARRIER COATINGS

TECHNICAL FIELD

The present invention relates to thermal barrier coatings for superalloy substrates, and more particularly to multilayered ceramic thermal barrier coatings for superalloy blades and vanes in gas turbine engines.

BACKGROUND

Turbine engines are used as the primary power source for various kinds of aircrafts. The engines are also auxiliary power sources that drive air compressors, hydraulic pumps, and industrial gas turbine (IGT) power generation. Further, the power from turbine engines is used for stationary power supplies such as backup electrical generators for hospitals and the like.

Most turbine engines generally follow the same basic power generation procedure. Compressed air is mixed with fuel and burned, and the expanding hot combustion gases are directed against stationary turbine vanes in the engine. The vanes turn the high velocity gas flow partially sideways to impinge on the turbine blades mounted on a rotatable turbine disk. The force of the impinging gas causes the turbine disk to spin at high speed. Jet propulsion engines use the power created by the rotating turbine disk to draw more air into the engine and the high velocity combustion gas is passed out of the gas turbine aft end to create forward thrust. Other engines use this power to turn one or more propellers, electrical generators, or other devices.

Since turbine engines provide power for many primary and secondary functions, it is important to optimize both the engine working life and the operating efficiency. However, technology advancements and engine efficiency improvements have led to rising gas temperatures inside an engine during operation. It is important for turbine blades and vanes to maintain their mechanical strength when exposed to heat, oxidation, and corrosive environments associated with an impinging gas. Blades, vanes, and other components are often coated with a thermal barrier coating to insulate the coated components, to inhibit oxidation and gas corrosion, and thereby prolong their workable life.

Some conventional thermal barrier coatings include a lower bond coat layer and an upper ceramic layer. Common formation methods for the upper ceramic layer include plasma spraying and electron beam physical vapor deposition (EB-PVD). Application by EB-PVD is particularly effective as it produces a ceramic layer having a columnar grained microstructure. Gaps between the individual columns allow for columnar grain expansion and contraction without developing stresses that could result in spalling.

One class of columnar thermal barrier coatings that may be produced by EB-PVD has a nanolaminate structure including hundreds to thousands of layers. Each layer includes a ceramic material such as stabilized zirconia and stabilized hafnia. Thermal barrier coatings having a nanolaminate structure provide sufficiently low thermal conductivity to protect turbine engine components such as blades and vanes during engine operation. However, there is a need for additional thermal barrier coatings having lower thermal conductivity.

There is a further need for highly stable and durable thermal barrier coatings having compliant microstructures.

SUMMARY OF THE INVENTION

The present invention provides an article having a thermal barrier coating. The article comprises a superalloy substrate having a columnar grained ceramic coat formed thereon. The ceramic coat comprises a nanolaminate region comprising repeating layers of ceramic material with each layer being less than 500 nm in thickness, with dispersions of metal oxide doping material situated between each of the layers. The ceramic coat further comprises at least one non-doped region with a thickness greater than 500 nm adjacent to the nanolaminate region, the non-doped region comprising a plurality of adjacent layers of ceramic material without dispersions of metal oxide doping material situated between each of the layers. In one embodiment, and by way of example only, a bond coat is formed between the substrate and the columnar grained ceramic coat. According to another embodiment, the superalloy substrate forms an adherent alumina scale, and no bond coat is necessary.

The present invention also provides a method of forming a thermal barrier coating on a substrate. Repeating layers of ceramic material are deposited onto the substrate, with each layer being less than 500 nm in thickness, to produce a first nanolaminate region. Metal oxide doping material is deposited between each of the repeating layers of ceramic material within the nanolaminate region. At some point during formation of the thermal barrier coating, a plurality of repeating layers of ceramic material are deposited without metal oxide doping material situated therebetween to form a non-doped region adjacent to the nanolaminate region, the non-doped region being greater than 500 nm in thickness.

Other independent features and advantages of the preferred apparatus and method will become apparent from the following detailed description, taken in conjunction with the accompanying drawings which illustrate, by way of example, the principles of the invention.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
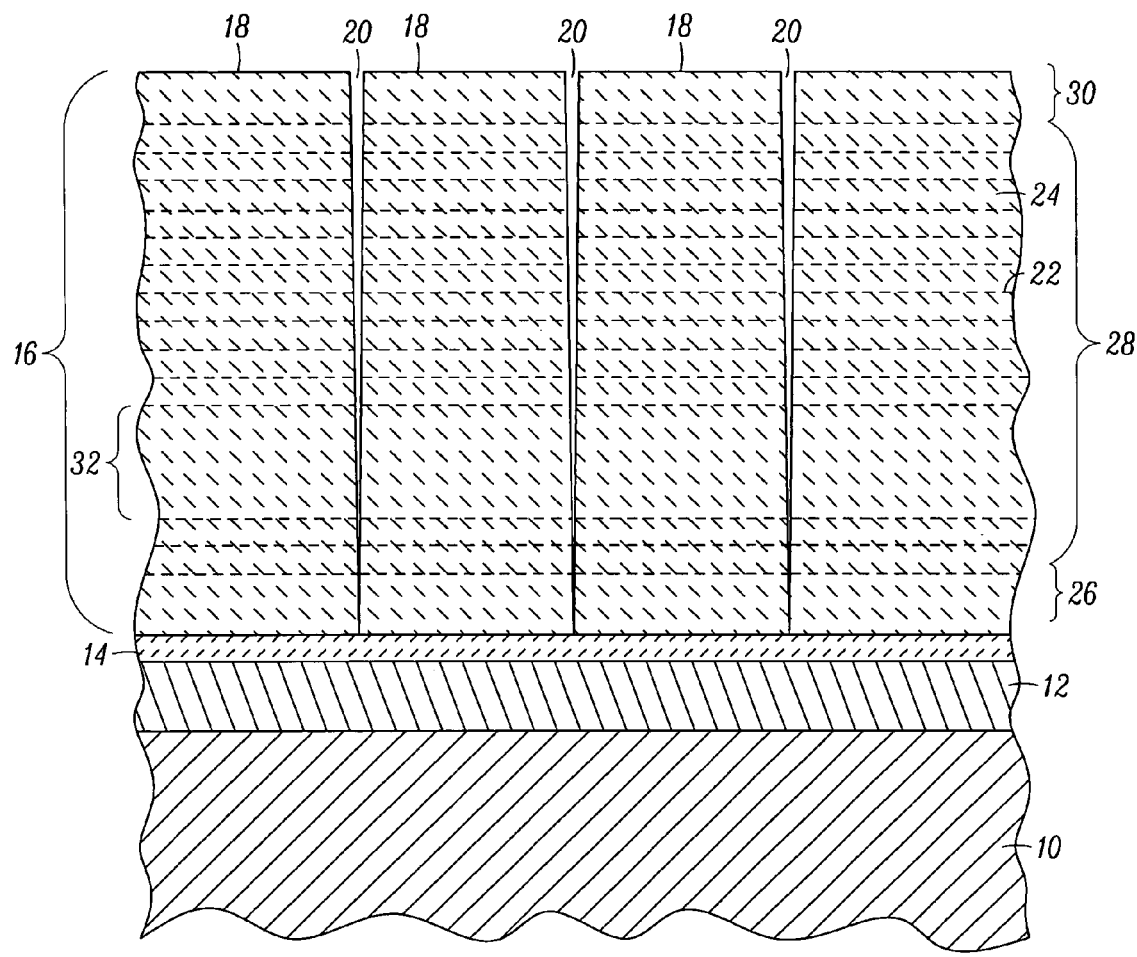
FIG. 1 is a cross sectional schematic of a coated article having a thermal barrier coating according to an embodiment of the present invention.

Referring to FIG. 1, a base metal or substrate 10 is a nickel, cobalt or iron based high temperature alloy from which turbine airfoils are commonly made. Preferably, the substrate 10 is a superalloy having hafnium and/or zirconium. Exemplary substrate materials are the superalloys MAR-M247, SC180, and MAR-M 509, the compositions of which are shown in Table 1.

TABLE 1

| Alloy | Mo | W | Ta | Al | Ti | Cr | Co | Hf | Zr | C | B | Ni |
|---|---|---|---|---|---|---|---|---|---|---|---|---|
| Mar-M247 | .65 | 10 | 3.3 | 5.5 | 1.05 | 8.4 | 10 | 1.4 | .055 | .15 | .15 | Bal. |
| SCI80 | 1.7 | 5 | 8.5 | 5.5 | 0.75 | 5 | 10 | 0.1 | 0 | 0 | 0 | Bal. |
| Mar-M509 | — | 7.0 | 3.5 | — | 0.25 | 23.4 | Bal. | — | .5 | .6 | — | 10 |

A bond coat 12 lies over the substrate 10. An exemplary bond coat material is a MCrAlY alloy having a broad elemental composition ranges of 10 to 35% chromium, 5 to 15% aluminum, 0.01 to 1% yttrium, or hafnium, or lanthanum, with M being the balance. M is selected from a group consisting of cobalt, nickel, and mixtures thereof. Minor amounts of other elements such as Ta or Si may also be included. The MCrAlY bond coat is preferably applied by EB-PVD, through sputtering, low pressure plasma or high velocity oxy fuel spraying or entrapment plating may also be used.

Another exemplary bond coat material is an intermetallic aluminide such as nickel aluminide or platinum aluminide. The aluminide bond coat can be formed using standard commercially available aluminide processes wherein aluminum is reacted at the substrate surface to form an aluminum intermetallic compound that provides a reservoir for the subsequent growth of an alumina scale oxidation resistant layer. Thus, the aluminide bond coat 12 is predominately composed of aluminum intermetallic (e.g., NiAl, CoAl and (Ni, Co) Al phases) formed by reacting aluminum vapor species, aluminum rich alloy powder, or an aluminum surface layer with the substrate elements in the outer region of the superalloy substrate 10. Aluminizing may be accomplished by one of several conventional prior art techniques including a pack cementation process, spraying, chemical vapor deposition, electrophoresis, sputtering, and appropriate diffusion heat treatments. Other beneficial materials can also be incorporated into diffusion aluminide coatings using a variety of processes. Beneficial materials may include Pt, Pd, Ir, Ru, Rh, Si, Hf, and Y. Oxide particles such as alumina, yttria, and hafnia may also be included for enhancement of alumina scale adhesion. Cr may also be added to improve hot corrosion resistance. Furthermore, Ni, Co may be added as beneficial materials for increasing ductility or incipient melting limits. In the specific case of platinum modified diffusion aluminide coating layers, the coating phases adjacent to the alumina scale will be platinum aluminide and/or nickel-platinum aluminide phases (i.e. on a Ni-base superalloy).

Through oxidation an alumina layer 14 is formed over the bond coat 12. This alumina layer 14 provides both oxidation resistance and a bonding surface for a ceramic coat 16. The alumina layer 14 may be formed before the ceramic coat 16 is applied, during application of coat 16, or subsequently by heating the coated article in an oxygen containing atmosphere at a temperature consistent with the temperature capability of the superalloy, or by exposure to the turbine environment. The alumina layer 14 will thicken on the aluminide surface by heating the material to normal turbine exposure conditions. The initial thickness of the alumina layer 14 is preferably no greater than about one micron. The alumina layer 14 may also be deposited by sol gel, chemical vapor deposition or by EB-PVD following deposition of the bond coat 12.

According to another embodiment, the previously-described bond coat 12 may be eliminated if the substrate 10 is capable of forming a highly adherent alumina scale or layer 14. Examples of such substrates are very low sulfur (<1 ppm) single crystal superalloys, such as PWA 1487 and Rene N5, which also contain 0.1% yttrium to enhance adhesion of the thermally grown alumina scale.

The ceramic coat 16 may be any of the conventional ceramic compositions used for this purpose. A preferred composition is yttria stabilized zirconia. Alternatively, the zirconia may be stabilized with $Nd_2O_3$, $Yb_2O_3$, $La_2O_3$, $CeO_2$ or $Y_2O_3$ and mixtures thereof. Another ceramic that may be used as the columnar type coating material is stabilized hafnia, which may be yttria-stabilized. The particular ceramic material selected should be stable in the high temperature environment of a gas turbine. The thickness of the ceramic layer may vary from 1 to 1000 microns but is preferably between 50 and 300 microns.

The ceramic coat 16 is applied by EB-PVD and as result has a columnar grained microstructure. The columnar grains or columns 18 may be oriented substantially perpendicular to the surface of the substrate 10 and extend outward from the bond coat 12. Between the individual columns 18 are micron sized intercolumnar gaps 20 that extend from the outer surface of the ceramic coat 16 to the alumina layer 14. It will be appreciated that the gaps are only illustrated in FIG. 1, and are not necessarily bounded by straight walls and need not have a constant width as depicted. In fact, the gaps tend to be wider at the outer surface and narrower as the gap extends toward the alumina layer.

Yttria concentration in the columns 18 may be graded. According to an exemplary embodiment, in a lower column region 26 adjacent the alumina layer 14 the percentage of yttria is on the order of 6 to 8 weight percent. The region 26 is preferably only a few microns in thickness. Overlying the lower region 26 is a large second region 28 that is stabilized with a percentage of yttria in the range of 6 to 25 percent. Preferably the yttria concentration range in the large second region 28 is 18 to 22 percent. As the large second region 28 is formed by a multi-evaporation source EB-PVD process, which is described in greater detail below, nanometer size particles of secondary phase metal oxides are deposited within the columnar zirconia grains, and preferably at interfaces 22 between nanolaminate (sub-micron) layers 24 of zirconia. The nanolaminate layers 24 in the large second region 28 have a thickness of at least 50 nm, and less than 500 nm, with a thickness range of 100 to 200 nm being preferred. The size of the interfacial dopant particles is preferably within a diameter range of 1 to 50 nm.

Overlying the large second region 28 is an outer region 30 that contains between 6 and 25 weight percent yttria, with 18 to 22 percent being preferred. The outer region 30 is optional and increases the thermal stability of the coating. The lower and outer regions 26 and 30 are optional, with neither being essential to the practice of the present invention.

As previously discussed, the large second region 28 may be produced by EB-PVD, although other methods such as small particle plasma spraying may be employed to deposit the constituent materials. The large second region 28 is primarily a nanolaminate structure including hundreds to thousands of layers 24, each layer being at least 50 nm in thickness, and less than 500 nm in thickness. Each layer includes a primary constituent material and a secondary constituent material, wherein the secondary constituent material is between 0.5 and 30 wt. % of the total nanolaminate structure, and preferably no more than 15 wt. % of the total nanolaminate structure. Exemplary primary materials include stabilized zirconia and stabilized hafnia. The secondary constituent material is a metal oxide that decorates interfaces between the primary constituent layers. Exemplary metal oxides include $Ta_2O_5$, $Al_2O_3$, $3Y_2O_3.5Al_2O_3$, $Gd_2Zr_2O_7$, metal monosilicates such as $Sc_2SiO_5$, $Y_2SiO_5$, $(RE)_2SiO_5$ (wherein RE is a rare earth metal), $Yb_2SiO_5$, and metal disilicates such as $Sc_2Si_2O_7$, $Y_2Si_2O_7$, and $(RE)_2Si_2O_7$ with monosilicates being preferred over disilicates. Each of the hundreds to thousands of compositionally decorated layer interfaces within a nanolaminate thermal barrier coating lowers thermal conductivity when compared with stabilized zirconia or hafnia coatings that do not include metal oxide particle decorated interfaces. Although the exact mechanisms are not known, it is hypothesized that the lowered thermal conductivity is attributed to one or more mechanisms produced by the presence of the metal oxide at the interfaces between each of the layers, including an improved interfacial porosity stability, an abrupt change in phase crystallography, and an abrupt change in phase density.

The large second region 28 also incorporates a non-doped region 32 including a plurality of thick layers of stabilized ceramic material, such as cubic hafnia or cubic zirconia, which are not decorated at the layer interfaces or otherwise doped with a metal oxide. Whereas the decorated layers 24 in the second region 28 are thinner than 500 nm and preferably much thinner, the thick layers in the non-doped region 32 are greater than 500 nm in thickness and may be as thick as 2.5 microns. It has been found that the non-doped region improves resistance to densification of the thermal barrier coating due to high temperature-related sintering that may occur during component operation. Resistance to such densification is provided by incorporating one or more non-doped regions 32 in the large second region 28, and the non-doped regions may be situated at various locations therein. Although the non-doped region 32 is depicted in FIG. 1 as being present slightly in the lower half of the large second region 28, it may be incorporated in the upper half, or adjacent to the bond layer 12, the thermally grown oxide layer 14, or any other layer situated under the ceramic coat 16.

Figure 2:
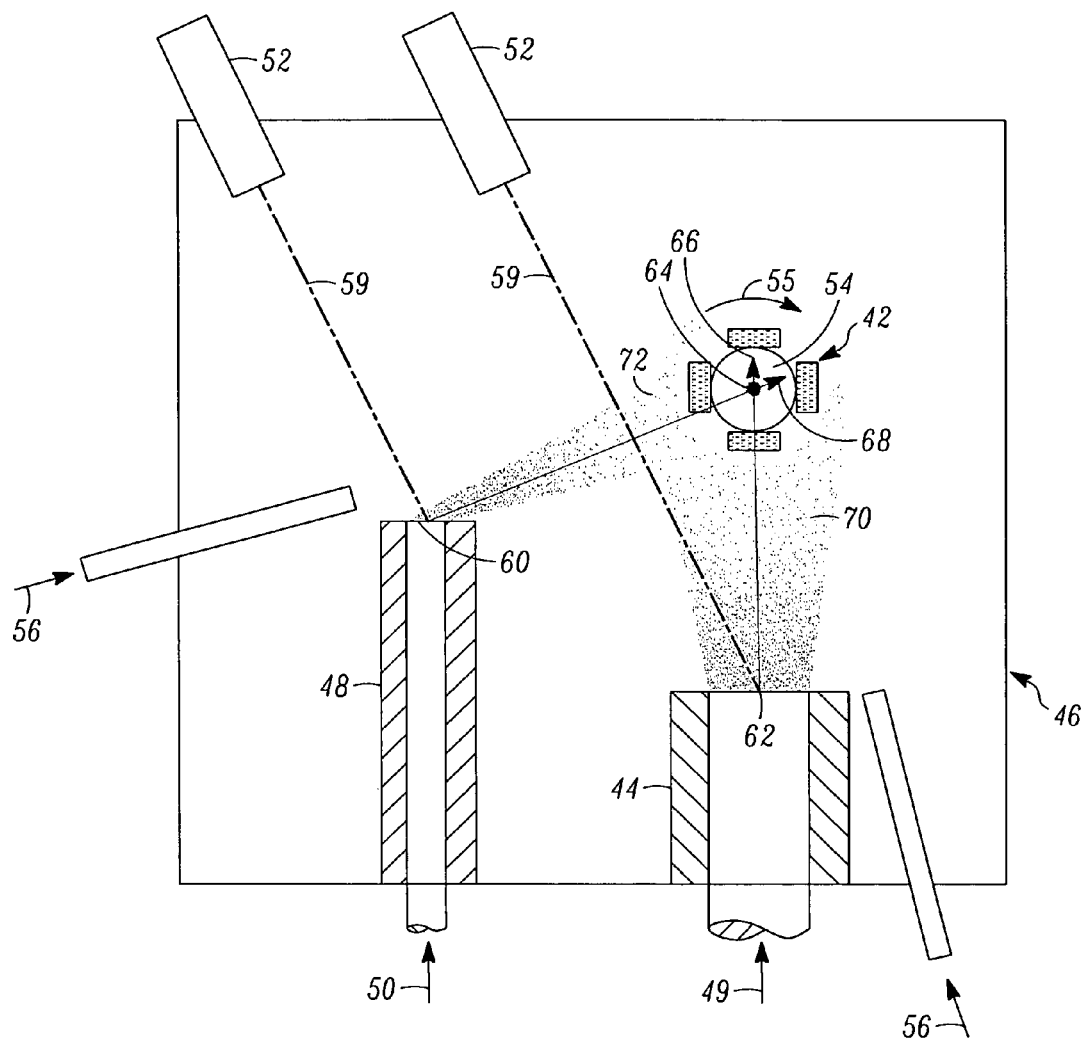
FIG. 2 is a schematic elevational view of a dual source, electron beam physical vapor deposition apparatus for forming a thermal barrier coating according to an embodiment of the present invention.

Referring now to FIG. 2, a dual source EB-PVD apparatus 40 is depicted to illustrate one exemplary method for forming the thermal barrier coating on an article 42 according to an embodiment of the present invention. The deposition process apparatus 40 includes a vacuum chamber 46 inside of which is placed a primary crucible 44 and a secondary crucible 48. Primary crucible 44 includes a primary longitudinal centerline and contains a ceramic material 49 such as a stabilized zirconia or hafnia ingot. The ceramic material 49 includes an evaporation surface that defines a plane with which the primary longitudinal centerline intersects to form a first intersection point 62. The secondary crucible 48 contains a metal oxide 50, such as ingots of $Ta_2O_5$, $Al_2O_3$, $3Y_2O_3.5Al_2O_3$, $Gd_2Zr_2O_7$, metal monosilicates such as $Sc_2SiO_5$, $Y_2SiO_5$, $(RE)_2SiO_5$ (wherein RE is a rare earth metal), $Yb_2SiO_5$, and metal disilicates such as $Sc_2Si_2O_7$, $Y_2Si_2O_7$, and $(RE)_2Si_2O_7$ with monosilicates being preferred over disilicates. The metal oxide 50 includes an evaporation surface that defines a plane with which the secondary longitudinal centerline intersects to form a second intersection point 60.

Protruding into the vacuum chamber 46 is a pair of electron beam guns 52, each of which is aimed toward a respective upper surface of the coating material within the primary crucible 44 and the secondary crucible 48. The articles 42, which may be turbine blades, vanes, or other similar components, are placed on a rotary holder 54 that rotates about an axis of rotation 64 in a direction such as that depicted by arrow 55. The rotary holder 54 is positioned within the vacuum chamber 46 such that a first imaginary line 66 and a second imaginary line 68 extend through the holder 54, wherein the first imaginary line 66 extends from the first intersection point 62 to the axis of rotation 64 and the second imaginary line 68 extends from the second intersection point 60 to the axis of rotation 64. An angle of at least 20 degrees is formed at the axis of rotation 64 by the imaginary lines 66, 68. Two oxygen bleed supply tubes 56 are placed within the vacuum chamber 46 such that a measured supply of oxygen is aimed in the direction of the articles 42. Upon actuation of the electron beam guns 52 a primary ceramic vapor cloud 70 and a secondary oxidized metallic vapor cloud 72 are produced.

Additional apparatuses that may perform a thermal barrier coating according to the present invention are described in U.S. Publication No. 2003/0207031, the entirety of which is hereby incorporated by reference. Each of the embodiments disclosed in the publication is capable of performing the method described in detail below with reference to the flow chart depicted in FIG. 3.

Figure 3:
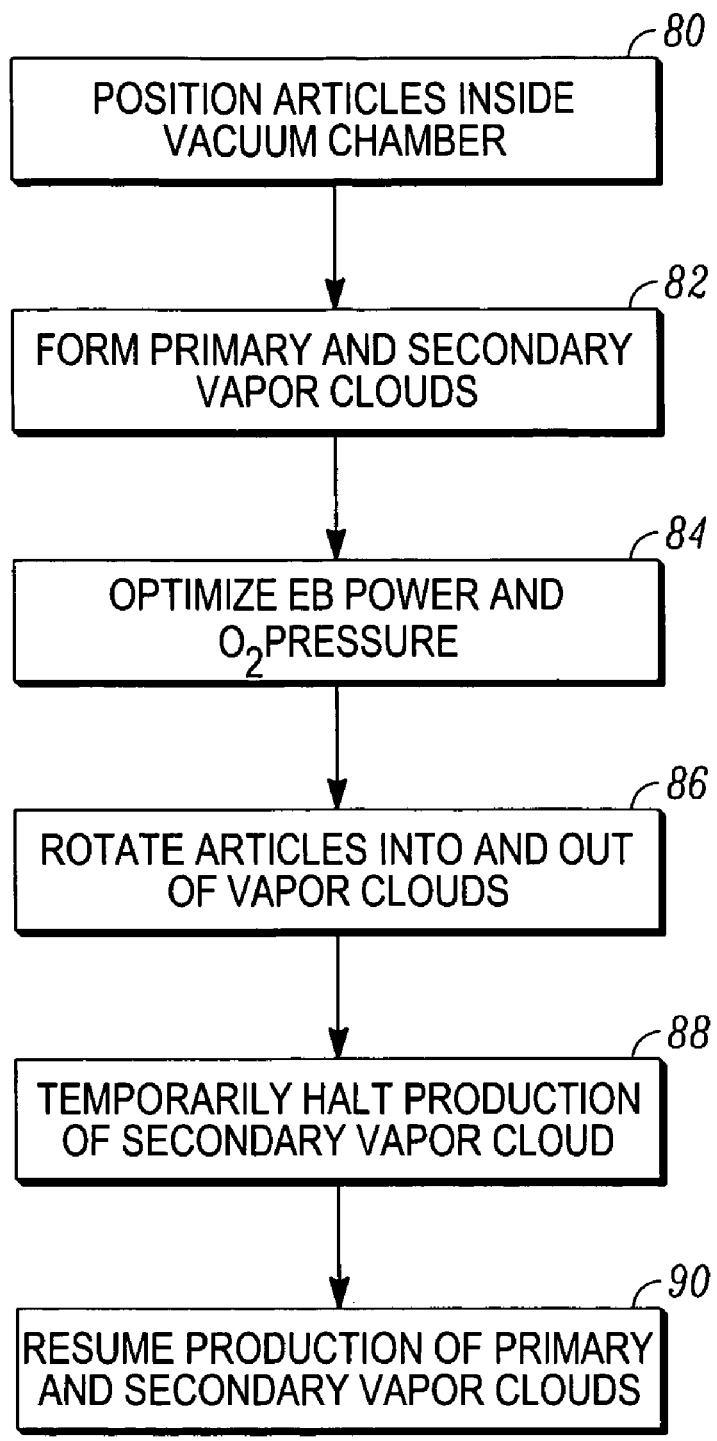
FIG. 3 is a flow chart illustrating a method for forming a thermal barrier coating according to an embodiment of the present invention.

An exemplary EB-PVD process for forming a thermal barrier coating begins by placing at least one article 42 to be coated inside the vacuum chamber 46 as step 80 of the method outlined in FIG. 3. More particularly, the article 42 is mounted on the rotary holder 54, which is positioned within a deposition zone 58 about which the article 42 will rotate with the rotary holder 54 and the crucibles positioned as previously described.

Next, the primary ceramic vapor cloud 70 and the secondary oxidized metallic vapor cloud 72 are produced as step 82 by aiming the electron beams 59 onto the evaporation surfaces of the ingots 49 and 50. Although some mixing occurs within the deposition zone, the electron beam will produce two generally compositionally distinct vapor clouds. Once the article 42 begins rotating, it will rotate into the primary ceramic vapor cloud 70 and then out of the primary vapor cloud 70 and into the oxidized metallic vapor cloud 72.

Prior to rotating the article, the deposition parameters are optimized as step 84, including the electron beam power and the oxygen pressure. Power from the electron beams 52 are apportioned to the ingots 49 and 50, with at least 70% of the vapor that deposits onto the article 26 will be derived from the primary vapor cloud 70, and at least 1% of the vapor that deposits onto the article 26 being derived from the secondary vapor cloud 72. An important deposition parameter includes adding a gas at between 0.015 and 0.030 torr of pressure to the chamber during deposition through the oxygen bleed supply tubes 56 to convert metallic vapor to an oxide vapor and direct it toward the articles on the rotating holder 54. In an exemplary embodiment, the gas is substantially pure oxygen. In another exemplary embodiment, the gas is oxygen combined with an inert gas. In some previous methods, the pressure of the oxygen was in the range of 0.0001 to 0.01 ton during coating deposition. However, the present inventors discovered that microstructural stability during EB-PVD is substantially enhanced by the increased oxygen concentration, assuring that a consistent and desirable stoichiometry is obtained in the deposited thermal barrier coating.

After performing the preparatory steps 80 to 84, the article 42 is rotated within the vapor clouds 70 and 72 to thereby deposit a multilayer nanolaminate thermal barrier coating composed of an alternating sequence of non-homogeneous layers. As previously described, the layers are composed of the primary ceramic material, including a ceramic such as yttria stabilized cubic or tetragonal zirconia and/or yttria stabilized cubic or tetragonal hafnia. The thickness of the nanolaminate layers is primarily dependent upon the substrate rotation rate and evaporation rate of the stabilized zirconia or stabilized hafnia vapor source. Variation of the substrate rotation rate or the electron beam power to the vapor source results in variation in layer thicknesses. The interfaces between each of the layers have dispersed oxide molecules or particles of metal oxide. These interfacial metal oxide layers include a mixture of finely dispersed, 1 to 50 nanometer-sized particles of the material from the secondary vapor cloud 72. In an exemplary embodiment, the coating deposition and article rotation rates are controlled so the multilayer zone 28 within the ceramic coat 16 has a minimum of one interfacial layer per micron of coating thickness. Thermal radiation from the evaporating ingot sources and non-illustrated electrical resistance heaters maintain article surfaces at temperatures within the 950 to 1150° C. range during coating deposition, with temperatures in the 1000 to 1100° C. range being preferred.

At some time during formation of the ceramic coat 16, production of the secondary vapor cloud 72 is halted as step 88. More particularly, the electron beam 59 is only apportioned to the ceramic ingot 49 and only the primary vapor cloud 70 is produced. The article continues to rotate into and out of the vapor cloud 70. Evaporation time may be increased in order to produce thicker layers of ceramic material to form the non-doped region 32 within the ceramic coat 16. As previously discussed, the non-doped region 32 is greater than 500 nm in thickness and may be as thick as 2.5 microns, although the non-doped region 32 may be thicker than 2.5 microns for some applications. After forming the non-doped region 32, the electron beam 59 is reapportioned to both of the ingots 49 and 50 to produce both the primary and secondary vapor clouds 70 and 72 as step 90, and the article rotation continues to produce a nanolaminate structure having metal oxide interfacial layers.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An article having a thermal barrier coating, the article comprising:
    a superalloy substrate; and
    a columnar grained ceramic coat overlying the substrate, the ceramic coat comprising:
    a) a first and a second nanolaminate region each comprising repeating layers of ceramic material with each layer being less than 500 nm in thickness, with dispersions of metal oxide doping material situated between each of the layers, and
    b) a non-doped region greater than 500 nm in thickness interposed between the first and second nanolaminate regions, the non-doped region comprising one or more adjacent layers of ceramic material without dispersions of metal oxide doping material situated between each of the layers.

2. The article according to claim 1, wherein the metal oxide doping material comprises at least one metal oxide selected from the group consisting of $Ta_2O_5$, $Al_2O_3$, $3Y_2O_3 \cdot 5Al_2O_3$, $Gd_2Zr_2O_7$, metal monosilicates, and metal disilicates.

3. The article according to claim 2, wherein the at least one metal oxide includes at least one metal monosilicate selected from the group consisting of $Sc_2SiO_5$, $Y_2SiO_5$, $(RE)_2SiO_5$, and $Yb_2SiO_5$, or at least one disilicate selected from the group consisting of $Sc_2Si_2O_7$, $Y_2Si_2O_7$, and $(RE)_2Si_2O_7$, wherein RE is a rare earth metal.

4. The article according to claim 3, wherein the at least one metal oxide includes $Y_2SiO_5$ or $Yb_2SiO_5$.

5. The article according to claim 1, wherein the ceramic material in the nanolaminate region and the non-doped region is at least one ceramic selected from the group consisting of stabilized zirconia and stabilized hafnia.

6. The article according to claim 5, wherein the metal oxide doping material is no more than 30 wt. % of the nanolaminate region.

7. The article according to claim 6, wherein the metal oxide doping material is between 0.5 and 15 wt. % of the nanolaminate region.

8. The article according to claim 1, wherein the columnar grained ceramic coat comprises the nanolaminate region formed both above and below the non-doped region.

9. The article according to claim 1, wherein the superalloy substrate forms an adherent alumina scale.

10. The article according to claim 1, further comprising a bond coat formed on the superalloy substrate, wherein the columnar grained ceramic coat is formed on the bond coat.

11. An article having a thermal barrier coating, the article comprising:
    a superalloy substrate;
    a columnar grained ceramic coat overlaying the superalloy substrate, the ceramic coat comprising a first and a second nanolaminate region comprising repeating layers of ceramic material with each layer being less than 500 nm in thickness, with dispersions of metal oxide doping material situated at the interfaces between each of the layers, the metal oxide doping material comprising at least one material selected from the group consisting of $Gd_2Zr_2O_7$, metal monosilicates, and metal disilicates; and
    a non-doped region interposed between the first and second nanolaminate regions, the non-doped region comprising one or more adjacent layers of ceramic material without dispersions of metal oxide doping material situated between each of the layers.

12. The article according to claim 11, wherein the metal oxide doping material includes at least one metal monosilicate selected from the group consisting of $Sc_2SiO_5$, $Y_2SiO_5$, $(RE)_2SiO_5$, and $Yb_2SiO_5$, or at least one disilicate selected from the group consisting of $Sc_2Si_2O_7$, $Y_2Si_2O_7$, and $(RE)_2Si_2O_7$, wherein RE is a rare earth metal.

* * * * *